(12) United States Patent
Takahashi

(10) Patent No.: US 6,950,343 B2
(45) Date of Patent: Sep. 27, 2005

(54) NONVOLATILE SEMICONDUCTOR MEMORY DEVICE STORING TWO-BIT INFORMATION

(75) Inventor: Satoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 10/717,622

(22) Filed: Nov. 21, 2003

(65) Prior Publication Data
US 2004/0100825 A1 May 27, 2004

Related U.S. Application Data

(63) Continuation of application No. PCT/JP01/04408, filed on May 25, 2001.

(51) Int. Cl.$^7$ ............................................. G11C 16/06
(52) U.S. Cl. ........................... 365/185.21; 365/185.03; 365/185.18
(58) Field of Search ...................... 365/185.21, 185.03, 365/185.18

(56) References Cited

U.S. PATENT DOCUMENTS 6,011,725 A * 1/2000 Eitan ..................... 365/185.33
6,172,905 B1 1/2001 White et al.
6,628,546 B2 * 9/2003 Ogura et al. ............ 365/185.21
6,670,669 B1 * 12/2003 Kawamura .................. 257/314

FOREIGN PATENT DOCUMENTS

JP 2001-57093 2/2001
JP 2001-118390 4/2001

OTHER PUBLICATIONS

International Publication No. WO 01/13378, published Feb. 22, 2001.

* cited by examiner

Primary Examiner—Huan Hoang
(74) Attorney, Agent, or Firm—Arent Fox PLLC

(57) ABSTRACT

A nonvolatile semiconductor memory device includes a memory cell transistor which is configured to store two bits inclusive of a first bit and a second bit at respective ends of an electric charge capturing film, a comparator which checks a data status by reading data of the first bit, and a potential switching circuit which changes potential conditions for writing of the second bit in response to whether the data status is 0 or 1.

8 Claims, 4 Drawing Sheets

NONVOLATILE SEMICONDUCTOR MEMORY DEVICE STORING TWO-BIT INFORMATION

This nonprovisional application claims the benefit of and is a continuation of International Application No. PCT/JP01/04408, filed May 25, 2001. The disclosure of the prior application is hereby incorporated herein in its entirety by reference.

BACKGROUND OF THE INVENTION

1. Field of the Invention

The invention generally relates to nonvolatile semiconductor memory devices, and particularly relates to a nonvolatile semiconductor memory device which stores electric charge in a nitride film.

2. Description of the Related Art

Some nonvolatile semiconductor memory devices utilize a nitride film as an electric charge capturing layer in a virtual ground array structure, thereby providing for a single memory cell transistor to store two-bit information. Such nonvolatile semiconductor memory devices treat the opposite ends of a single nitride film situated between two bit lines as two separate memory cells, and store two-bit data by controlling whether hot electron is injected into these two cells. This is made possible by the characteristics of the nitride film serving as an electric charge capturing layer in that electric charge does not move in such a film.

In nonvolatile semiconductor memory devices, generally, all the bit lines receive the same write potential at their drain node at the time of a write operation by which hot electron is injected. Further, the potential applied to the drain nodes stays the same whether a write-verify operation is performed or a data-read operation is performed.

The method as described above that stores two-bit information in the single electric charge capturing layer has a drawback in that the threshold of one cell is affected by the threshold of the other cell. Depending on whether one of the cells is in a programmed state or in an erased state, the threshold of the other cell varies. If a fixed write potential is used as in the conventional method, a threshold obtained after a write operation varies depending on the state of the other cell. The threshold of a cell after a write operation is higher when the other cell is in the programmed state than when the other cell is in the erased state.

This creates threshold variation among individual memory cells within one sector after the completion of a write operation. Such threshold variation causes variation in inter-band tunnel currents at the time of erase operations. This results in further threshold variation following erase operations, which brings about a delay in an erase time and the degradation of rewrite characteristics.

Accordingly, there is a need for a nonvolatile semiconductor memory device which reduces threshold variation following a write operation.

SUMMARY OF THE INVENTION

It is a general object of the present invention to provide a nonvolatile semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, including a memory cell transistor which is configured to store two bits inclusive of a first bit and a second bit at respective ends of an electric charge capturing film, a comparator which checks a data status by reading data of the first bit, and a potential switching circuit which changes potential conditions for writing of the second bit in response to whether the data status is 0 or 1.

In the invention described above, when data is to be written in a memory cell provided at one end of the electric charge capturing film of a given memory cell transistor, potential conditions (write potentials, verify potentials, and a reference-cell-threshold potential) for write operations are changed according to data stored in a memory cell provided at the other end of the electric charge capturing film of this memory cell transistor. This can prevent thresholds from having variation after the data-write operation.

Specifically, the threshold after the writing of the cell A is relatively low if the cell B is in the erased state (data "1"). In this case, thus, relatively high write and verify potentials are used to increase the amount of electric charge injection, thereby achieving a desired threshold level following the write operation. On the other hand, the threshold after the writing of the cell A is relatively high if the cell B is in the programmed state (data "0"). In this case, thus, relatively low write and verify potentials are used to decrease the amount of electric charge injection, thereby achieving a desired threshold level following the write operation.

According to another aspect of the invention, a nonvolatile semiconductor memory device includes a memory cell transistor which is configured to store two bits at respective ends of an electric charge capturing film, and a potential switching circuit which supplies a first drain potential to the memory cell transistor at a time of a read operation, and supplies a second drain potential higher than the first drain potential at a time of a write-verify operation.

In the invention described above, the drain potential for the write-verify operation is set higher than the drain potential for the read operation, thereby reducing influence of the other memory cell of the electric charge capturing film. This prevents threshold fluctuation after the write operation.

Other objects and further features of the present invention will be apparent from the following detailed description when read in conjunction with the accompanying drawings.

BEST MODE FOR CARRYING OUT THE INVENTION

In the following, embodiments of the present invention will be described with reference to the accompanying drawings.

Figure 1:
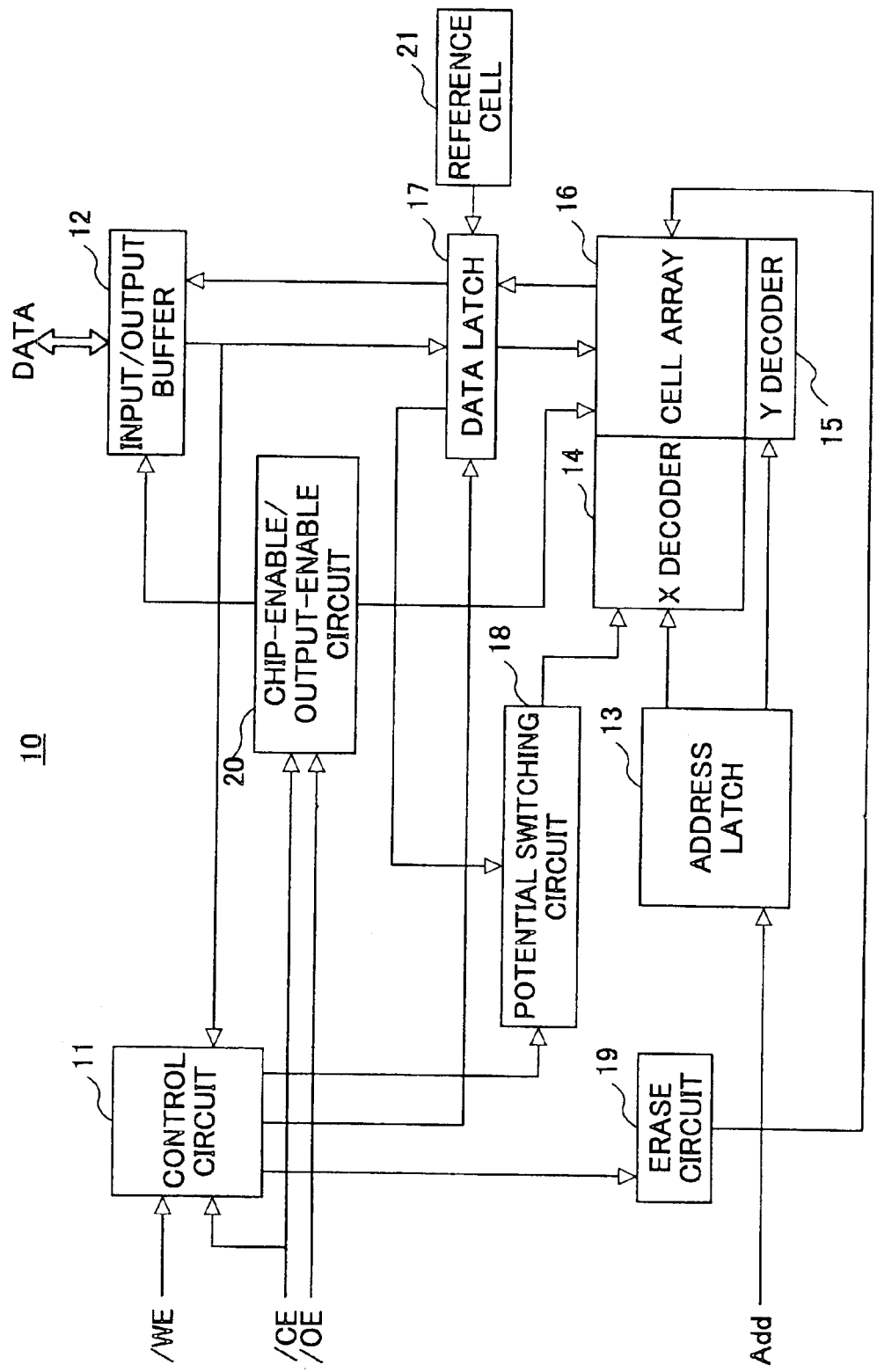
FIG. 1 is a block diagram showing the construction of a nonvolatile semiconductor memory device according to the present invention.

FIG. 1 is a block diagram showing the construction of a nonvolatile semiconductor memory device according to the present invention.

A nonvolatile semiconductor memory device 10 of FIG. 1 includes a control circuit 11, an input/output buffer 12, an address latch 13, an X decoder 14, a Y decoder 15, a cell array 16, a data latch (comparator) 17, a potential switching circuit 18, an erase circuit 19, a chip-enable/output-enable circuit 20, and a reference cell 21.

The control circuit 11 receives control signals from an exterior of the device. The control circuit 11 operates as a state machine based on the control signals, and controls various parts of the nonvolatile semiconductor memory device 10.

The input/output buffer 12 receives data from the exterior of the device, and supplies the data to the data latch 17. The address latch 13 receives address signals from the exterior of the device, and latches these address signals for provision to the X decoder 14 and the Y decoder 15. The X decoder 14 decodes the address supplied from the address latch 13, and activates a word line of the cell array 16 according to the decoded address. The Y decoder 15 decodes the address supplied from the address latch 13, and selectively reads data appearing on bit lines of the cell array 16 according to the decoded address signals, thereby supplying the read data to the data latch 17.

The cell array 16 includes an array of memory cell transistors, word lines, bit lines, etc., and stores two-bit information in each memory cell transistor. At the time of data-read operations, data of memory cells specified by an activated word line are retrieved to the bit lines. At the time of program operations or erase operations, word lines and bit lines are set to respective proper potentials required for these operations, thereby achieving the injection or ejection of electric charge into or from the memory cells.

The data latch (comparator) 17 compares the level of data supplied from the cell array 16 via the Y decoder 15 with a reference level indicated by the reference cell 21, thereby determining whether the data is 0 or 1. The determination is supplied to the input/output buffer 12 as read data. A verify operation associated with a program operation or an erase operation is also performed by comparing the level of data supplied from the cell array 16 via the Y decoder 15 with a reference level indicated by the reference cell 21.

The potential switching circuit 18 generates potentials applied to the word lines and bit lines at the time of write operations (program operations), and also generates potentials applied to the word lines and bit lines at the time of read operations. These potentials are supplied to the X decoder 14. The erase circuit 19 generates potentials applied to the word lines and bit lines at the time of erase operations, thereby performing an erase operation in respect of the cell array 16 on per-sector basis.

The chip-enable/output-enable circuit 20 receives a chip-enable signal /CE and an output-enable signal /OE as control signals from the exterior of the device, thereby controlling activation/deactivation of the input/output buffer 12 and the cell array 16.

In a first embodiment of the invention, when data is written in a memory cell at one end of an electric charge capturing layer of a memory cell transistor, data stored in a memory cell provided at the other end of the electric charge capturing layer of the memory cell transistor is retrieved to the data latch 17. Depending on the content of the read data, the potential switching circuit 18 changes a potential generated for a write operation.

Figure 2:
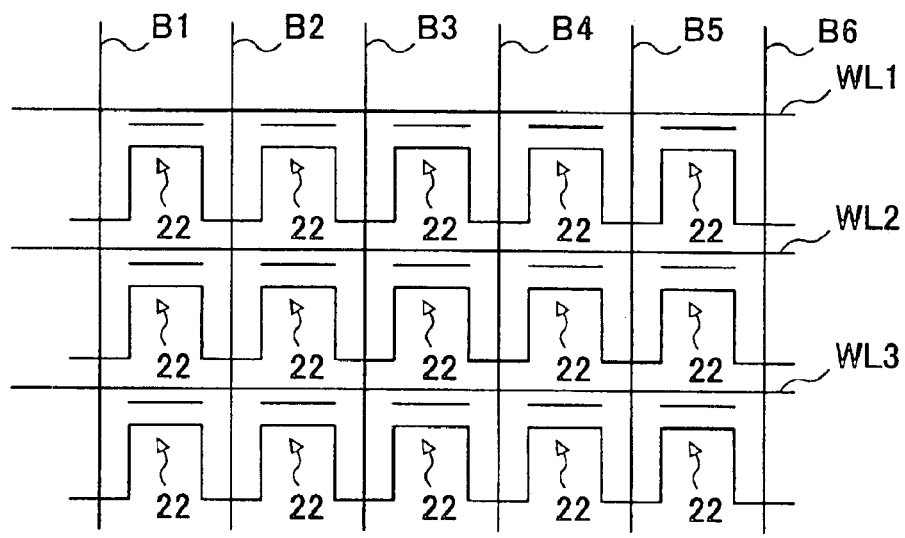
FIG. 2 is a drawing showing part of a cell array.

FIG. 2 is a drawing showing part of the cell array 16.

As shown in FIG. 2, the cell array 16 includes a plurality of word lines WL1 through WL3 and a plurality of bit lines B1 through B6. A plurality of memory cell transistors 22 are arranged in an array form such that two bit lines adjacent to each other function as a drain and a source, with a word line functioning as a gate.

Figure 3:
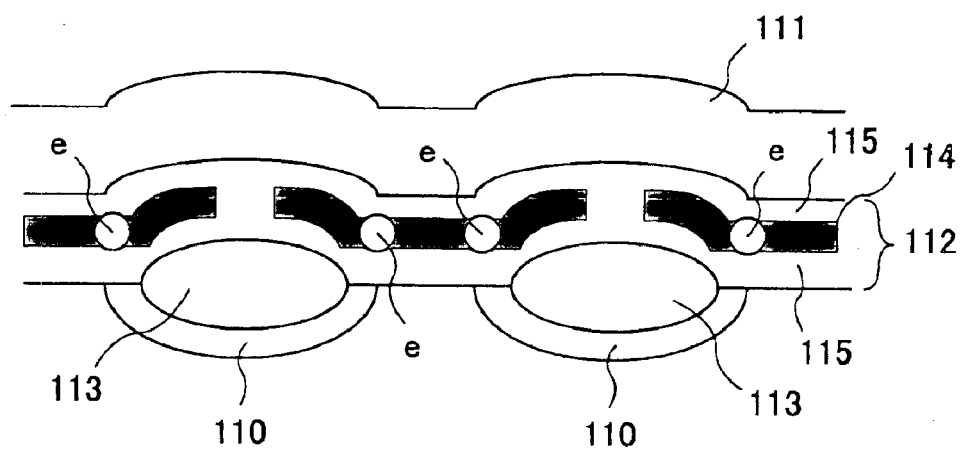
FIG. 3 is a cross sectional view of part of the cell array.

FIG. 3 is a cross sectional view of part of the cell array 16.

The construction of FIG. 3 includes a buried diffusion layer 110, a word line 111, an electric charge capturing layer 112, and a bit-line oxide 113. The electric charge capturing layer 112 has an ONO (oxide-nitride-oxide) configuration, which is comprised of a nitride film 114 serving as an electric charge capturing film and an oxide film 115. This provides a memory cell transistor which is capable of storing hot electron in the electric charge capturing layer 112. The word line 111 corresponds to the gate of the memory cell transistor, and the buried diffusion layer 110 corresponds to the source and drain of the memory cell transistor.

In order to facilitate the understanding of the invention, a description will be first given of conventional data-write/data-read operations.

One of the two buried diffusion layers 110 corresponding to a given memory cell transistor is treated as a drain to receive a high potential (e.g., 5 V), and the other one is treated as a source to receive a reference potential (e.g., a power-supply ground potential VSS). Further, the word line 111 corresponding to this memory cell transistor is given a high potential (e.g., 9 V). This creates hot electron in the vicinity of the buried diffusion layer 110 on the drain side (i.e., the side to which the high potential is applied), and electric charge e is injected into the electric charge capturing film 114. At position where the electric charge e is stored in the electric charge capturing film 114 is closer to the buried diffusion layer 110 that receives the high potential as a drain.

The drain side is then treated as a source side and coupled to the reference potential, and the source side is treated as a drain side and coupled to the high potential. This stores electric charge e on the opposite side of the electric charge capturing film 114. In this manner, electric charge e can be injected to the opposite ends of the electric charge capturing layer 112, thereby providing for two-bit storage in a single memory cell transistor. This is made possible by the characteristics of the nitride film 114 in that electric charge does not move in the electric charge capturing material of the electric charge capturing film 114.

When information indicative of injected electric charge (electron) is to be read, the buried diffusion layer 110 that was on the drain side at the time of the write operation is given the reference potential, and the buried diffusion layer 110 that was on the source side at the time of the write operation is provided with a read potential (e.g., 1.5 V). Further, a read-gate potential (e.g., 5 V) is applied to the word line 111. A write operation is thus performed.

When injected electric charge (electron) is to be erased, the buried diffusion layer 110 that was on the drain side at the time of the write operation is given a high potential (e.g., 5 V), and the buried diffusion layer 110 that was on the source side at the time of the write operation is placed in the floating state. In addition, a high negative potential (e.g., −5

V) is applied to the word line 111. This injects holes into the electric charge capturing film 114 as they are generated by an inter-band tunnel current that flows from the buried diffusion layer 110 receiving the high potential to the substrate. The captured electrons are thus neutralized, thereby effecting an erase operation.

As described above, the conventional data-write operation applies a high potential (e.g., 5 V) to one of the bit lines serving as a drain, and couples a reference potential (e.g., the power supply ground potential VSS) to the other bit line serving as a source, with the word line of this memory cell transistor being provided with a high potential (e.g., 9 V). As previously described, however, the threshold of a memory cell at one end of the electric charge capturing film is affected by the state of the data that is stored in a memory cell provided at the other end. Across-the-board application of a constant write potential thus results in variation of the thresholds obtained after data write operations.

In the first embodiment of the present invention, when data is to be written in a memory cell provided at one end of the electric charge capturing film of a given memory cell transistor, a write potential, a verify potential, and a reference-cell-threshold potential are changed according to data stored in a memory cell provided at the other end of the electric charge capturing film of this memory cell transistor. This can prevent thresholds from having variation after a data-write operation.

Figure 4:
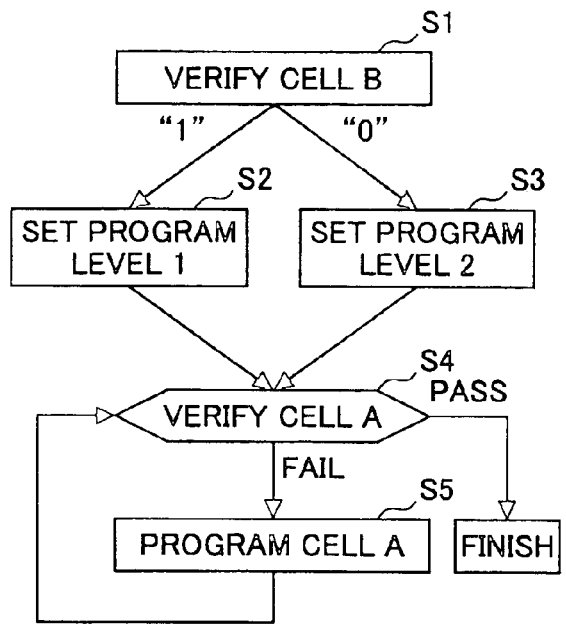
FIG. 4 is a flowchart showing a data-write operation according to a first embodiment of the invention.

FIG. 4 is a flowchart showing a data-write operation according to the first embodiment of the invention. This flowchart will be used to explain a write operation with respect to a cell A where the cell A is situated at one end of the electric charge capturing film of a memory cell transistor, and a cell B is situated at the other end.

At step S1, a verify operation in respect of the cell B is carried out. With reference to FIG. 1, the data of the cell B is read from the cell array 16 via the Y decoder 15 to the data latch 17. The level of the read data is compared with the reference level of the reference cell 21, thereby checking the data. If the data is "1", the procedure goes to step S2. If the data is "0", the procedure goes to step S3.

At step S2, the program level is set to Program Level 1. At step S3, the program level is set to Program Level 2. With reference to FIG. 1, the result of a data check that is supplied from the data latch 17 to the potential switching circuit 18 is referred to. Based on this check result, the potential switching circuit 18 sets potentials for writing and verifying the cell A to Program Level 1 if the data of the cell B is "1". The potential switching circuit 18 sets potentials for writing and verifying the cell A to Program Level 2 if the data of the cell B is "0".

At step S4, a verify operation in respect of the cell A is performed according to the program level that has been set. If the verify operation passes, the procedure comes to an end. If the verify operation fails, the procedure goes to step S5, at which a write operation in respect of the cell A is carried out according to the program level that has been set. Thereafter, the procedure goes back to step S4 to perform the verify operation again.

The program levels set at the steps S2 and S3 determine drain and gate potentials for write operations and verify operations as well as a threshold of a verify-purpose reference cell. An example is provided below (Vg is a gate potential, and Vd is a drain potential).

Program Level 1
  Cell Write Potential:
    Vg=9.0 V, Vd=5.0 V
  Cell Write Verify Potential:
    Vg=5.0 V, Vd=1.0 V
  Cell Write Verify Reference-Cell Threshold:
    Vth=4.5 V
Program Level 2
  Cell Write Potential:
    Vg=8.5 V, Vd=4.5 V
  Cell Write Verify Potential:
    Vg=4.5 V, Vd=1.0 V
  Cell Write Verify Reference-Cell Threshold:
    Vth=4.0 V In this manner, potentials for writing and verifying the cell A are controlled according to the data content of the cell B, thereby suppressing threshold variation after the data write operation. Specifically, the threshold after the writing of the cell A is relatively low if the cell B is in the erased state (data "1"). In this case, thus, relatively high write and verify potentials such as those of Program Level 1 are used to increase the amount of electric charge injection, thereby achieving a desired threshold level following the write operation. On the other hand, the threshold after the writing of the cell A is relatively high if the cell B is in the programmed state (data "0"). In this case, thus, relatively low write and verify potentials such as those of Program Level 2 are used to decrease the amount of electric charge injection, thereby achieving a desired threshold level following the write operation.

In the following, a second embodiment of the invention will be described.

In the second embodiment of the present invention, a drain potential for write-verify operations is set higher than a drain potential for read operations. This reduces an effect of the other memory cell of the electric charge capturing film so as to suppress threshold variation after writing.

In general, a drain potential is raised to reduce an influence from the other memory cell of the electric charge capturing film. It is undesirable to raise the drain potential for data read operations because such a rise causes charge gain through read disturbance. In write-verify operations, however, the time period during which a verify potential is applied to a memory cell transistor is much shorter than the time period during which a read potential is applied at the time of read operations. Accordingly, the use of a relatively high verify potential at the time of write verify operations will not cause a problem.

Figure 5:
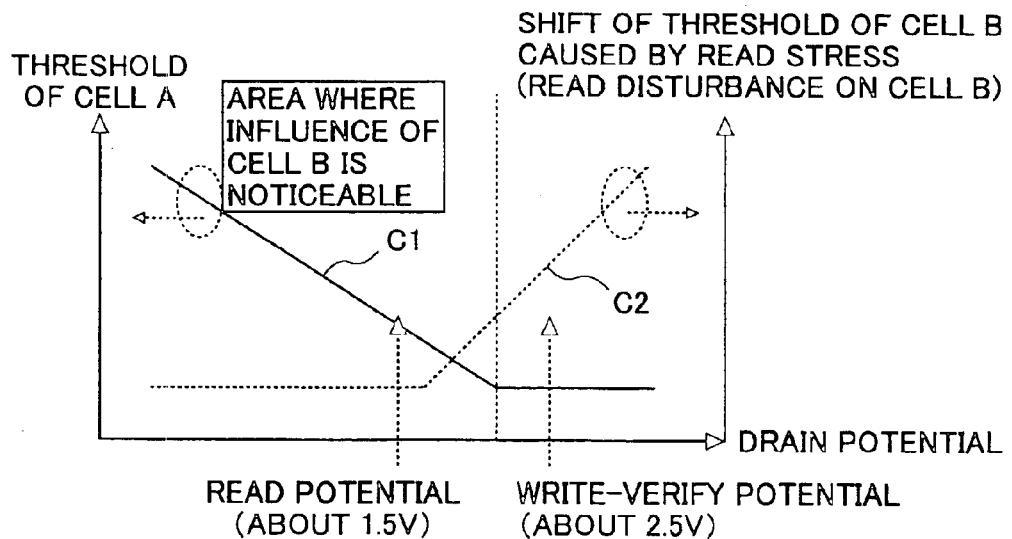
FIG. 5 is a drawing showing a drain potential and threshold dependency between memory cells.

FIG. 5 is a drawing showing a drain potential and threshold dependency between memory cells.

In FIG. 5, the drain potential is shown along the horizontal axis, and the threshold of the cell A is shown along one of the vertical axes, with the other vertical axis representing a shift of the threshold of the cell B, which is caused by a stress from the reading of the cell A. Sequential lines C1 represent how much the threshold of the cell A increases by the effect of the electric charge of the cell B when the drain potential is applied at the time of reading or verifying the cell A. As shown by the sequential lines C1, the cell B hardly has an effect on the threshold of the cell A if the drain potential is high. As the drain potential lowers, an effect of the cell B on the threshold of the cell A increases. The drain potential generally used for reading data is 1.5 V. With the drain potential at the level of 1.5 V, as shown in FIG. 5, the threshold of the cell A rises due to an influence from the electric charge of the cell B.

In FIG. 5, sequential lines C2 illustrates how much the threshold of the cell B moves when the drain potential is applied at the time of reading of the cell A. As shown by the sequential lines C2, a stress caused by the reading of the cell A hardly causes read disturbance on the cell B if the drain potential is low. As the drain potential increases, an effect of the read disturbance on the cell B increases. The drain potential generally used for reading data is 1.5 V, which is set such as not to cause data transformation through read disturbance.

As described above, the time period during which a verify potential is applied to a memory cell transistor in write-verify operations is much shorter than the time period during which a read potential is applied at the time of read operations. Even if a relatively high verify potential is used for write-verify operations, therefore, a stress caused by the reading of the cell A will not cause a problem by disturbing the cell B.

In the present invention, the drain potential for write-verifying of the cell A is set to 2.5 V, for example, which insures that there is no effect from the cell B. This drain potential is also such a potential as not to cause error in the data of the cell B through the write-verify operations. As can be seen from FIG. 5, the drain potential for write-verify operations is set higher than the drain potential for read operations.

With reference FIG. 1, the potential switching circuit 18 generates potentials to be applied to the word lines and bit lines at the time of write operations, and also generates potentials to be applied to the word lines and bit lines at the time of read operations. In the first embodiment, for example, a potential of 1.5 V that is applied to the bit line on the drain side at the time of read operations may also be applied to the drain side at the time of write verify operations. In the second embodiment, the potential switching circuit 18 further generates 2.5 V as a drain potential for write verify operations, which is then supplied to the X decoder 14.

Figure 6:
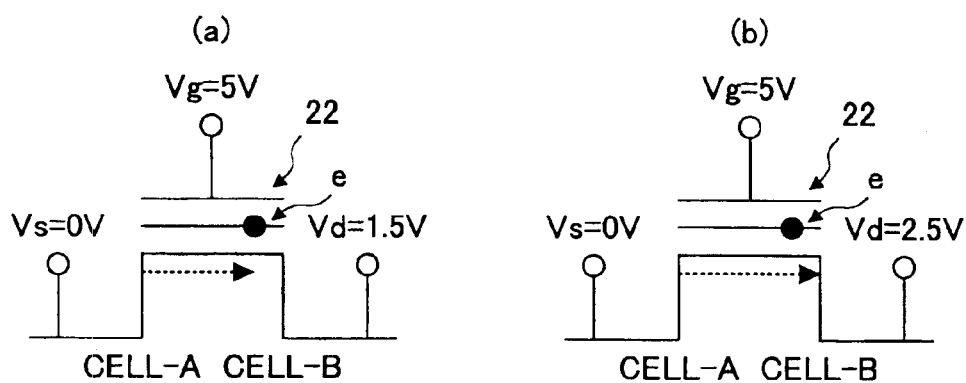
FIG. 6 is a drawing showing differences of potential settings between read operations and write-verify operations.

FIG. 6 is a drawing showing differences of potential settings between read operations and write-verify operations.

FIG. 6(a) demonstrates potentials that are applied to the gate node, drain node, and source node of a memory cell transistor 22 at the time of read operations. The gate receives Vg=5 V, and the drain and the source receive Vd=1.5 V and Vs=0 V, respectively. What is shown here is a read operation with respect to the cell A, with the cell B having electric charge e injected in it.

FIG. 6(b) illustrates potentials that are applied to the gate node, drain node, and source node of a memory cell transistor 22 at the time of write verify operations. The gate receives Vg=5 V, and the drain and the source receive Vd=2.5 V and Vs=0 V, respectively.

In this manner, the second embodiment of the invention increases the drain potential for write-verify operations relative to the drain potential for read operations while avoiding erroneous data writing, thereby reducing an influence from the other memory cell of the electric charge capturing film. This insures that the threshold after write operations does not fluctuate.

The first embodiment and the second embodiment may independently be performed, or may simultaneously performed.

Further, the present invention is not limited to these embodiments, but various variations and modifications may be made without departing from the scope of the present invention.

What is claimed is:

1. A nonvolatile semiconductor memory device, comprising:
   a memory cell transistor which is configured to store two bits inclusive of a first bit and a second bit at respective ends of an electric charge capturing film;
   a comparator which checks a data status by reading data of the first bit; and
   a potential switching circuit which changes potential conditions for writing of the second bit in response to whether the data status is 0 or 1.

2. The nonvolatile semiconductor memory device as claimed in claim 1, wherein said potential switching circuit changes a write potential for the second bit in response to whether the data status is 0 or 1.

3. The nonvolatile semiconductor memory device as claimed in claim 1, wherein said potential switching circuit changes a write-verify potential for the second bit in response to whether the data status is 0 or 1.

4. The nonvolatile semiconductor memory device as claimed in claim 1, further comprising a reference cell whose threshold changes in response to whether the data status is 0 or 1.

5. A nonvolatile semiconductor memory device, comprising:
   a memory cell transistor which is configured to store two bits at respective ends of an electric charge capturing film; and
   a potential switching circuit which supplies a first drain potential to said memory cell transistor at a time of a read operation, and supplies a second drain potential higher than the first drain potential at a time of a write-verify operation.

6. The nonvolatile semiconductor memory device as claimed in claim 5, wherein the second drain potential, when one of the two bits is subjected to the write verify operation, is as high as to be substantially free from influence of another one of the two bits, and is as low as to avoid erroneous writing in said another one of the two bits.

7. A method of writing in respect of a nonvolatile semiconductor memory device, comprising the steps of:
   checking a data status by reading data of a first bit from a memory cell transistor which is configured to store two bits inclusive of the first bit and a second bit at respective ends of an electric charge capturing film;
   determining potential conditions for writing of the second bit in response to whether the data status is 0 or 1; and
   performing a write operation with respect to the second bit by the determined potential conditions.

8. The method of writing in respect of a nonvolatile semiconductor memory device, comprising a step of reading data from a memory cell transistor at a time of a write-verify operation by applying a second drain potential higher than a first drain potential that is applied to the memory cell transistor at a time of a read operation, said memory cell transistor being configured to store two bits at respective ends of an electric charge capturing film.

* * * * *